United States Patent
Whelan et al.

(10) Patent No.: US 8,413,938 B2
(45) Date of Patent: Apr. 9, 2013

(54) HAND RAIL MOUNTING BRACKET FOR AN ELECTRICAL PANEL

(75) Inventors: Brendan Whelan, Fort McMurray (CA); Chad Whelan, Fort McMurray (CA)

(73) Assignee: Brendan Whelan, Fort McMurray (CA)

( * ) Notice: Subject to any disclaimer, the term of this patent is extended or adjusted under 35 U.S.C. 154(b) by 68 days.

(21) Appl. No.: 13/088,245

(22) Filed: Apr. 15, 2011

(65) Prior Publication Data

US 2011/0253852 A1 Oct. 20, 2011

Related U.S. Application Data

(60) Provisional application No. 61/325,007, filed on Apr. 16, 2010.

(51) Int. Cl.
*E04G 21/00* (2006.01)

(52) U.S. Cl.
USPC .......................................... 248/201; 248/316.8

(58) Field of Classification Search .................. 248/201, 248/316.8, 316.7, 205.1, 214, 222.51, 215, 248/308; 16/368
See application file for complete search history.

(56) References Cited

U.S. PATENT DOCUMENTS

| | | |
|---|---|---|
| 2,995,670 A | 8/1961 | Weiss |
| 4,275,797 A | 6/1981 | Johnson |
| 4,318,156 A | 3/1982 | Gallagher |
| 4,686,608 A | 8/1987 | Hosking |
| 4,998,277 A * | 3/1991 | Rioux, Jr. ...................... 379/454 |
| 4,998,700 A * | 3/1991 | McKaig ........................ 248/214 |
| 5,035,630 A | 7/1991 | Norsworthy |
| 5,485,932 A * | 1/1996 | Romm et al. .............. 211/87.01 |
| 5,489,078 A * | 2/1996 | Risley ...................... 248/231.81 |
| 5,544,003 A | 8/1996 | Vaughan |
| 5,553,823 A * | 9/1996 | Protz, Jr. ....................... 248/304 |
| 5,634,618 A * | 6/1997 | Farmer et al. ................. 248/201 |
| 6,608,406 B2 | 8/2003 | Bersiek |
| 6,653,562 B2 | 11/2003 | Kochanski |
| 2004/0251387 A1 * | 12/2004 | Kim et al. ..................... 248/201 |
| 2006/0146581 A1 | 7/2006 | Murphy |
| 2007/0284492 A1 * | 12/2007 | Oh ............................. 248/220.1 |
| 2011/0168855 A1 * | 7/2011 | Bonczyk et al. .............. 248/201 |

FOREIGN PATENT DOCUMENTS

DE   10 2008 014 851 B3   5/2009

OTHER PUBLICATIONS

Official Action from the Canadian Intellectual Property Office mailed Oct. 4, 2010, issued in related Canadian Application No. 2,554,685, filed Jul. 25, 2006, 2 pages.

* cited by examiner

*Primary Examiner* — Ramon Ramirez
(74) *Attorney, Agent, or Firm* — Christensen O'Connor Johnson Kindness PLLC

(57) ABSTRACT

A bracket for mounting an electrical panel to a handrail has a first portion having a U-shaped portion for receiving the handrail, a second portion having an attachment for attaching to the electrical panel, and a pivotal connection connecting the first portion to the second portion.

9 Claims, 4 Drawing Sheets

HAND RAIL MOUNTING BRACKET FOR AN ELECTRICAL PANEL

FIELD

This relates to a mounting bracket for mounting an electrical panel on a hand rail.

BACKGROUND

On worksites, it is necessary to provide electrical power to various locations. Electrical panels are used to help distribute the power.

SUMMARY

There is provided a bracket for mounting an electrical panel to a handrail. The bracket comprises a first portion having a U-shaped portion for receiving the handrail, a second portion having an attachment for attaching to the electrical panel, and a pivotal connection connecting the first portion to the second portion.

According to another aspect, there is provided, in combination, the handrail bracket as described above as an upper handrail bracket, and a lower handrail bracket comprising a receiving body for receiving a lower handrail support, the receiving body having a vertically adjustable attachment for attaching to the electrical panel.

According to other aspects, the receiving body of the lower handrail bracket may comprise a U-shaped receiving body defining a downward-oriented opening. The lower mounting bracket may comprise a vertically oriented slot and the lower handrail bracket may be slidably attached in the slot by a pin connection. The second portion of the upper handrail bracket may be attached to an upper mounting bracket on the electrical panel.

According to another aspect, there is provided, in combination, an electrical panel having an upper mounting bracket and a lower mounting bracket, an upper handrail bracket as described above attached to the upper mounting bracket of the electrical panel, and a lower handrail bracket as described above attached to the lower mounting bracket of the electrical panel.

According to another aspect, there is provided a method of mounting an electrical panel to a handrail, the electrical panel comprising an upper mounting bracket and a lower mounting bracket, the lower mounting bracket comprising a vertical slot, the handrail comprising an upper handrail and a lower handrail support, the method comprising the steps of: providing an upper handrail bracket comprising a first portion having a U-shaped portion, a second portion having an attachment, and a pivotal connection connecting the first portion to the second portion; providing a lower handrail bracket comprising a receiving body, the receiving body having a vertically-adjustable attachment; attaching the second portion of the upper handrail bracket to the upper mounting bracket of the electrical panel via the attachment and the lower handrail bracket to the lower mounting bracket of the electrical panel; inserting the handrail into the U-shaped portion of the upper handrail bracket and pivoting the second portion such that the upper handrail bracket overlies the handrail and the electrical panel is relatively vertical; and positioning the lower handrail support below the receiving body of the lower handrail bracket and moving the lower handrail bracket along the vertical slot until the lower handrail support is received within the receiving body.

According to other aspects, the lower handrail bracket may be attached to a lower mounting bracket on the electrical panel, where the lower mounting bracket comprises a vertically-oriented slot. The second portion of the upper handrail bracket may be attached to an upper mounting bracket on the electrical panel.

BRIEF DESCRIPTION OF THE DRAWINGS

These and other features will become more apparent from the following description in which reference is made to the appended drawings, the drawings are for the purpose of illustration only and are not intended to be in any way limiting, wherein.

DETAILED DESCRIPTION

A bracket system for mounting an electrical panel onto a handrail will now be described with reference to FIGS. 1 through 8.

Figure 6:
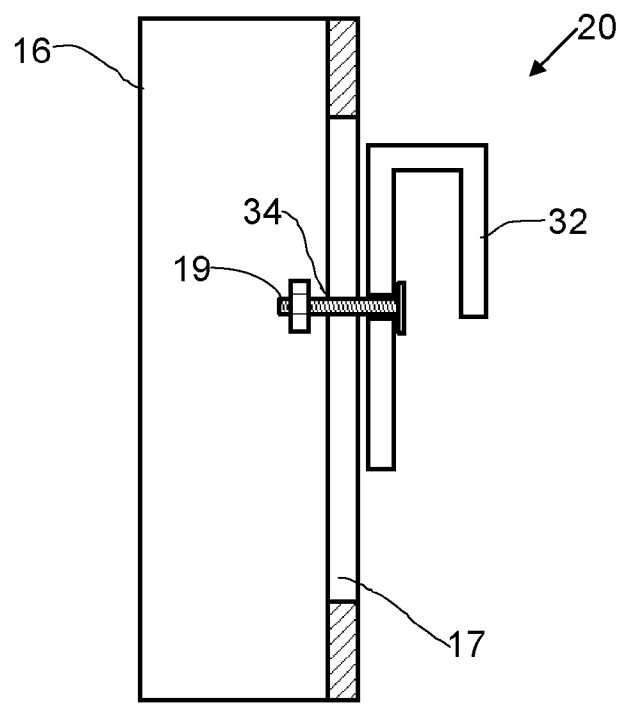
FIG. 6 is a side elevation view in section of the lower handrail bracket on a lower mounting bracket.
Figure 7:
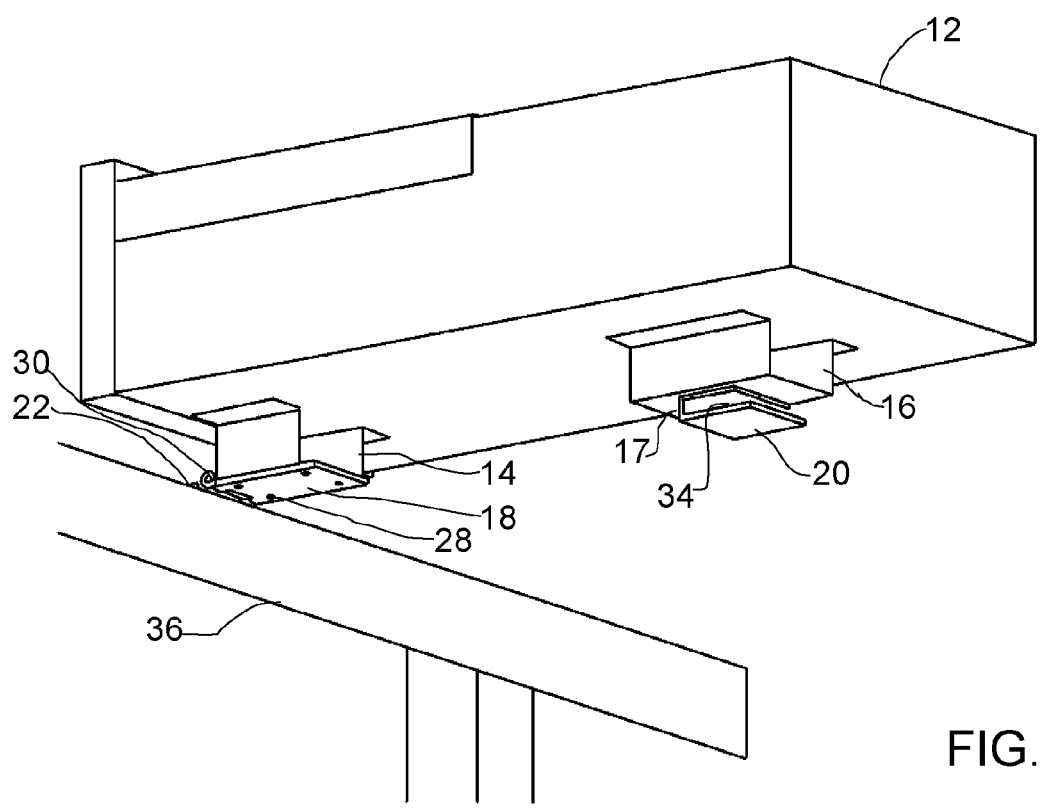
FIG. 7 is a perspective view of the upper and lower handrail brackets attached to an electrical panel.
Figure 8:
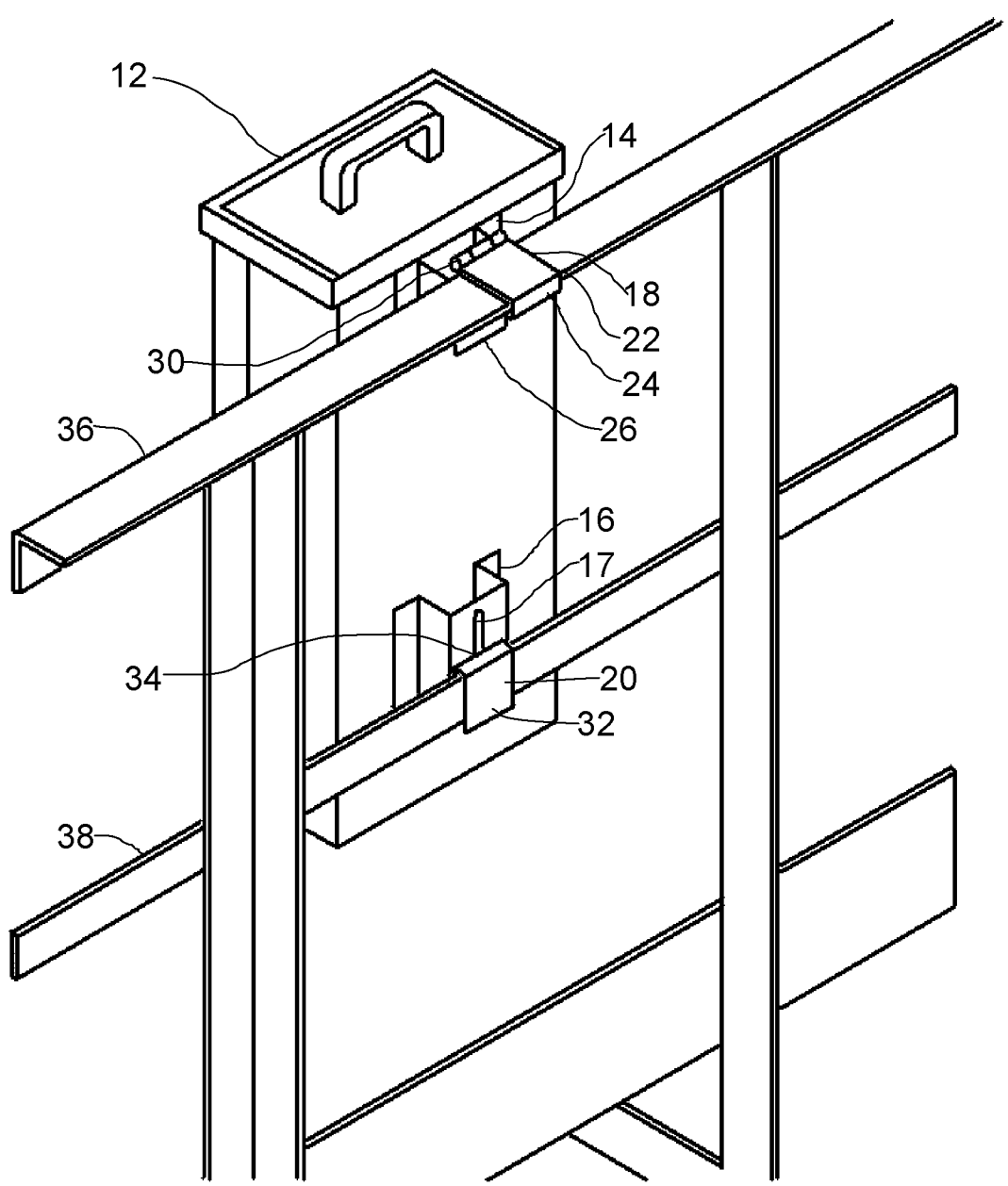
FIG. 8 is a perspective view of the electrical panel installed on a handrail.

Referring to FIG. 7, an electrical panel 12 has an upper mounting bracket 14 and a lower mounting bracket 16. Referring to FIG. 8, there is an upper handrail bracket 18 attached to upper mounting bracket 14 and a lower handrail bracket 20 attached to lower mounting bracket 16. Upper and lower mounting brackets 14 and 16 may be already attached to electrical panel 12, or they may be attached at the time of installation. Furthermore, upper handrail bracket 18 may be permanently attached to, or integrally formed with, upper mounting bracket 14. Lower handrail bracket 20 may be permanently attached to lower mounting bracket 16 by a vertically adjustable connection 34, as some movement is required by lower handrail bracket 20 relative to electrical panel 12 during installation to properly position lower handrail bracket 20. Referring to FIG. 6, in a preferred embodiment, connection 34 is a sliding connection formed by providing lower mounting bracket 16 with a vertical slot 17 that allows a pin connection 19 secured to lower handrail bracket 20 to move vertically relative to electrical panel 12. Other sliding connections 34 will be apparent to those skilled in the art. This allows the installer to lift lower handrail bracket 20, position electrical panel 12, and let bracket 20 fall into place.

Figure 1:
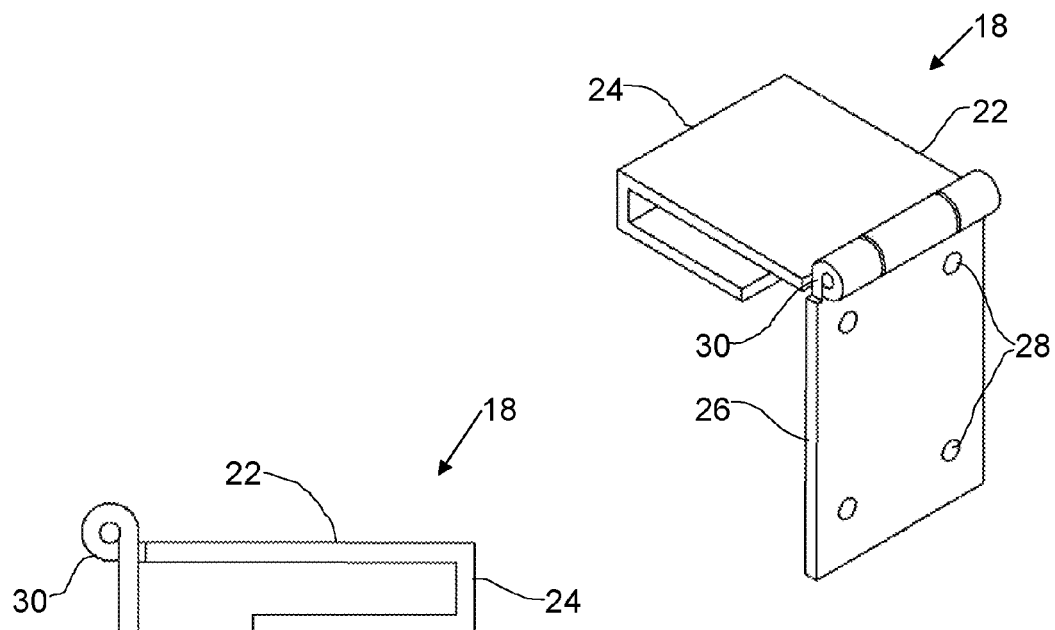
FIG. 1 is a perspective view of an upper handrail bracket.
Figure 2:
FIG. 2 is a side elevation view of the upper handrail bracket.
Figure 3:
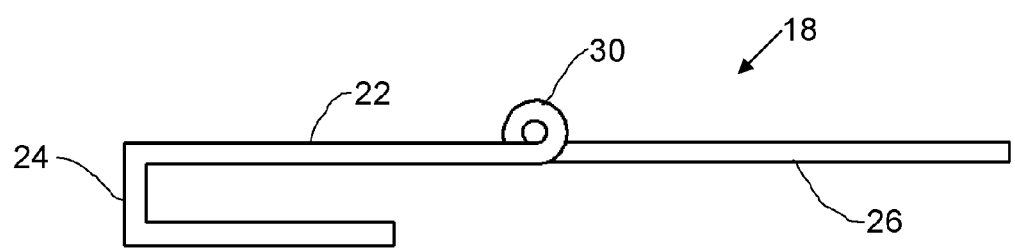
FIG. 3 is a side elevation view of the upper handrail bracket in an extended position.

Referring to FIG. 1, upper handrail bracket 18 has a first portion 22 having a U-shaped cross-section 24 and a second portion 26 having an attachment 28 for attaching to upper mounting bracket 14 of electrical panel 12 (as shown in FIG. 7). As shown, attachment 28 is a series of apertures. First portion 22 is connected to second portion 26 by a pivotal connection 30 that allows first and second portions 22 and 26 to pivot between an angled position shown in FIG. 2 and a relatively flat position shown in FIG. 3. The position shown in FIG. 3 is intended to simplify and permit installation on a handrail, while the position shown in FIG. 2 is the installed position that helps secure upper handrail bracket 18, and therefore electrical panel 12, on a handrail.

Figure 4:
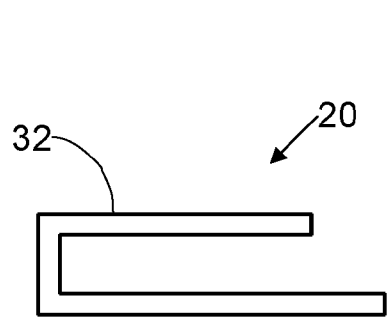
FIG. 4 is a side elevation view of a lower handrail bracket.
Figure 5:
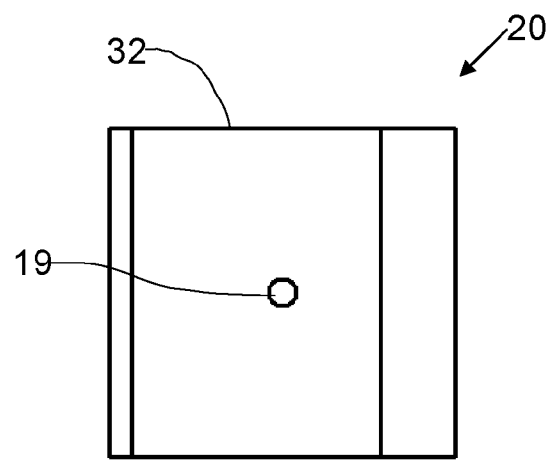
FIG. 5 is a front elevation view of the lower handrail bracket.

Referring to FIGS. 4 and 5, lower handrail bracket 20 preferably has a U-shaped, receiving body 32 with an attachment 34 for attaching to lower mounting bracket 16 of electrical panel 12 (as shown in FIG. 7. As shown, attachment 34 includes a pin connection 19 that engages slot 17, such that the vertical position of lower handrail bracket 20 may be adjusted.

Referring to FIG. 8, upper and lower handrail brackets 18 and 20 are used to install electrical panel 12 on a handrail, which has an upper handrail 36 and a lower handrail support 38. Upper handrail 36 is shown as an angle iron, and lower handrail support 38 is shown as a flat bar, and the discussion below will be given in that context. However, it will be understood that the attachment portions of upper handrail bracket 18 and lower handrail bracket 20 may be designed to accommodate different sizes and shapes. For example, upper handrail 36 may be a square tubing, which requires upper handrail bracket 18 to have a wider U-shaped cross-section 24. It will be understood that, in order to properly mount upper handrail bracket 18 in this manner, upper handrail 36 must have a cross-section with upper and lower opposed, parallel faces, that allows first portion 22 to engage and hold handrail 36. The same restriction is not placed on lower handrail bracket 20.

Referring to FIG. 7, upper handrail bracket 18 is attached to upper mounting bracket 14 by using pin connections through attachment 28. Lower handrail bracket 20 may be loosely attached to lower mounting bracket 16 by a pin connection through attachment 34 and slot 17. Upper handrail bracket 18 is extended to a substantially horizontal position, such that electrical panel 12 is also substantially horizontal, which allows U-shaped portion to engage upper handrail 36. As can be seen, first portion 22 is substantially the same length as the width of upper handrail 36. Referring to FIG. 8, as second portion 26 of upper handrail bracket 18 is pivoted about pivotal connection 30 to lower electrical panel 12 into the vertical position, upper handrail 36 is secured within U-shaped portion 24 by second portion 26. Once upper handrail bracket 18 is installed, lower handrail bracket 20 is installed by lifting it along slot 17 above lower handrail support 38, and lowering it such that lower handrail support 38 enters receiving body 32. The pin connection through attachment 34 and slot 17 can then be tightened to secure lower handrail bracket 20 in place, which also prevents any movement about pivotal connection 30, which is necessary to dislodge electrical panel 12 from the handrail.

It will be apparent that other types of lower handrail brackets 20 may be used, such as a clamp that is positioned vertically first, then clamped onto lower handrail support 38, such as a structure similar to a scaffolding clamp.

In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

The following claims are to be understood to include what is specifically illustrated and described above, what is conceptually equivalent, and what can be obviously substituted. Those skilled in the art will appreciate that various adaptations and modifications of the described embodiments can be configured without departing from the scope of the claims. The illustrated embodiments have been set forth only as examples and should not be taken as limiting the invention. It is to be understood that, within the scope of the following claims, the invention may be practiced other than as specifically illustrated and described.

What is claimed is:

1. In combination:
   an electrical panel;
   an upper handrail bracket comprising:
      a first portion having a U-shaped portion for receiving a handrail;
      a second portion attached to the electrical panel; and
      a pivotal connection connecting the first portion to the second portion; and
   a lower handrail bracket comprising a receiving body for receiving a lower handrail support, the receiving body being attached to a lower mounting bracket of the electrical panel by a pin and slot connection, the slot permitting relative movement of the pin within the slot such that the receiving body is vertically adjustable relative to the electrical panel.

2. The combination of claim 1, wherein the receiving body of the lower handrail bracket comprises a U-shaped receiving body defining a downward-oriented opening.

3. The combination of claim 1, wherein the second portion of the upper handrail bracket is attached to an upper mounting bracket on the electrical panel.

4. The combination of claim 1, wherein the lower mounting bracket comprises a vertically oriented slot and the lower handrail bracket is slidably attached in the slot by a pin connection.

5. A method of mounting an electrical panel to a handrail, the handrail comprising an upper handrail and a lower handrail support, the method comprising:
   providing an upper handrail bracket comprising a first portion having a U-shaped portion, and a second portion attached to the electrical panel, and a pivotal connection connecting the first portion to the second portion;
   providing a lower handrail bracket comprising a receiving body, the receiving body being movably attached to the electrical panel;
   inserting the upper handrail into the U-shaped portion of the upper handrail bracket and pivoting the second portion such that the upper handrail bracket overlies the handrail and the electrical panel is relatively vertical; and
   positioning the receiving body of the lower handrail bracket above the lower handrail support and moving the lower handrail bracket until the lower handrail support is received within the receiving body.

6. The method of claim 5, wherein the lower handrail bracket is attached to a lower mounting bracket on the electrical panel, the lower mounting bracket comprising a vertically-oriented slot.

7. The method of claim 5, wherein the second portion of the upper handrail bracket is attached to an upper mounting bracket on the electrical panel.

8. The combination of claim 7, wherein the receiving body of the lower handrail bracket comprises a U-shaped receiving body defining a downward-oriented opening.

9. In combination:
   an electrical panel having an upper mounting bracket;
   an upper handrail bracket comprising:
      a first portion having a U-shaped portion for receiving a handrail;
      a second portion attached to the upper mounting bracket of the electrical panel; and
      a pivotal connection connecting the first portion to the second portion; and a lower handrail bracket comprising a receiving body for receiving a lower handrail support, the receiving body being vertically adjustable relative to the electrical panel.

* * * * *

UNITED STATES PATENT AND TRADEMARK OFFICE
CERTIFICATE OF CORRECTION

PATENT NO. : 8,413,938 B2  
APPLICATION NO. : 13/088245  
DATED : April 9, 2013  
INVENTOR(S) : B. Whelan et al.

Page 1 of 1

It is certified that error appears in the above-identified patent and that said Letters Patent is hereby corrected as shown below:

In the claims

| COLUMN | LINE | ERROR |
|---|---|---|
| 4 (Claim 4) | 26 | following "wherein" insert --the receiving body is attached to a lower mounting bracket, and wherein-- |

Signed and Sealed this  
Ninth Day of February, 2016

Michelle K. Lee  
*Director of the United States Patent and Trademark Office*